(12) United States Patent
Hsu

(10) Patent No.: US 7,294,559 B2
(45) Date of Patent: Nov. 13, 2007

(54) WAFER DICING PROCESS FOR OPTICAL ELECTRONIC PACKING

(75) Inventor: Chain-Hau Hsu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/328,094

(22) Filed: Jan. 10, 2006

(65) Prior Publication Data

US 2006/0286773 A1    Dec. 21, 2006

(30) Foreign Application Priority Data

Jun. 16, 2005    (TW) .............................. 94120067 A

(51) Int. Cl.
  *H01L 21/30*    (2006.01)
(52) U.S. Cl. ................. 438/460; 438/458; 438/113; 257/E23.009
(58) Field of Classification Search ................ 438/113, 438/455, 464
  See application file for complete search history.

(56) References Cited

U.S. PATENT DOCUMENTS 4,738,935 A * 4/1988 Shimbo et al. ............. 438/455
5,369,060 A * 11/1994 Baumann et al. ........... 438/460
6,165,815 A * 12/2000 Ball ........................... 438/113
6,541,352 B2 * 4/2003 Wachtler .................... 438/460
2005/0042844 A1* 2/2005 Yee ............................. 438/462
2006/0121693 A1* 6/2006 Yang et al. ................. 438/458

* cited by examiner

*Primary Examiner*—Scott B. Geyer
*Assistant Examiner*—Reema Patel
(74) *Attorney, Agent, or Firm*—Birch, Stewart, Kolasch & Birch, LLP

(57) ABSTRACT

A wafer dicing process for optical electronic packing is provided. The process includes: providing a first wafer (glass wafer) and a second wafer (interposer wafer); etching the second wafer to form a reference flat coordinate; laminating the first wafer on the second wafer; providing a third wafer (CMOS wafer); laminating the third wafer under the second wafer; cutting the first wafer by a first dicing saw according to the reference flat coordinate; and cutting the third wafer by a second dicing saw to form a first reference axis and a second reference axis perpendicular to each other and to establish a backside dicing reference coordinate. The process not only can reduce wearing loss of the dicing saws but also ensure to form high quality cutting edges and a precise backside dicing reference coordinate.

6 Claims, 4 Drawing Sheets

WAFER DICING PROCESS FOR OPTICAL ELECTRONIC PACKING

BACKGROUND OF THE INVENTION

1. Field of the Invention

The present invention relates to a wafer dicing process for optical electronic packing, and more particularly to a wafer dicing process for optical electronic packing, which elongates the lifetime of the dicing saws and forms high quality cutting plane and a precise backside dicing reference coordinate.

2. Description of the Prior Art

In the field of optical electronic packing, a package has to perform multiple functions. Therefore the structure of the package in wafer level packing possibly consists of several materials. FIG. 1A and FIG. 1B schematically illustrate a traditional wafer dicing process for optical electronic packing. The structure of the package contains three wafers with different materials and functions, including a first wafer p10 (glass wafer), a third wafer p30 (Complementary Metal-Oxide Semiconductor, CMOS) wafer, and a second wafer p20 (interposer wafer) which separates the first wafer p10 a distance from the third wafer p30. These three wafers form a laminated structure for optical electronic packing. The traditional method to dice the packed wafer is cutting through by a single dicing saw p40. By using this method, the cutting plane of the wafer package is not smooth and forming a rough plane p31. It not only affects the cutting precision, but also increases the wearing rate of the dicing saw p40 by using this single dicing saw to cut through the laminated waters.

SUMMARY OF THE INVENTION

In view of the foregoing, it is an object of the present invention to provide a wafer dicing process for optical electronic packing, which can ensure the quality of the reference flat coordinate and avoid cutting misalignment to damage the package due to the distorting axis of the reference coordinate.

According to one embodiment of the present invention, the wafer dicing process for optical electronic packing is including the following steps: providing a first wafer with a first upper surface and a first lower surface; providing a second wafer with a second upper surface and a second lower surface; etching the second wafer to form a first flat and a second flat perpendicular to each other and to establish a reference flat coordinate by them; laminating the first wafer on the second wafer, in which the second upper surface of the second wafer faces to the first lower surface of the first wafer; providing a third wafer having an active surface; laminating the third wafer under the second wafer, in which the active surface of the third wafer faces to the lower surface of the second wafer; cutting the first wafer by a first dicing saw from its upper surface along the first flat and the second flat according to the reference flat coordinate to reveal the third wafer; and cutting the third wafer by a second dicing saw from the active surface along the first flat and the second flat according to the reference flat coordinate to form a first reference axis and a second reference axis perpendicular to each other and to establish a backside dicing reference coordinate.

In the previous process, the first wafer is a glass wafer and the first dicing saw is specified for cutting a glass wafer. The second wafer is adopted as an interposer wafer. The third wafer is a CMOS (Complementary Metal-Oxide Semiconductor) wafer and the second dicing saw is specified for cutting a CMOS wafer. The method for laminating the first and the second wafers is by hot-pressing as well as for laminating the second and the third wafers.

DESCRIPTION OF THE PREFERRED EMBODIMENT

Figure 1A:
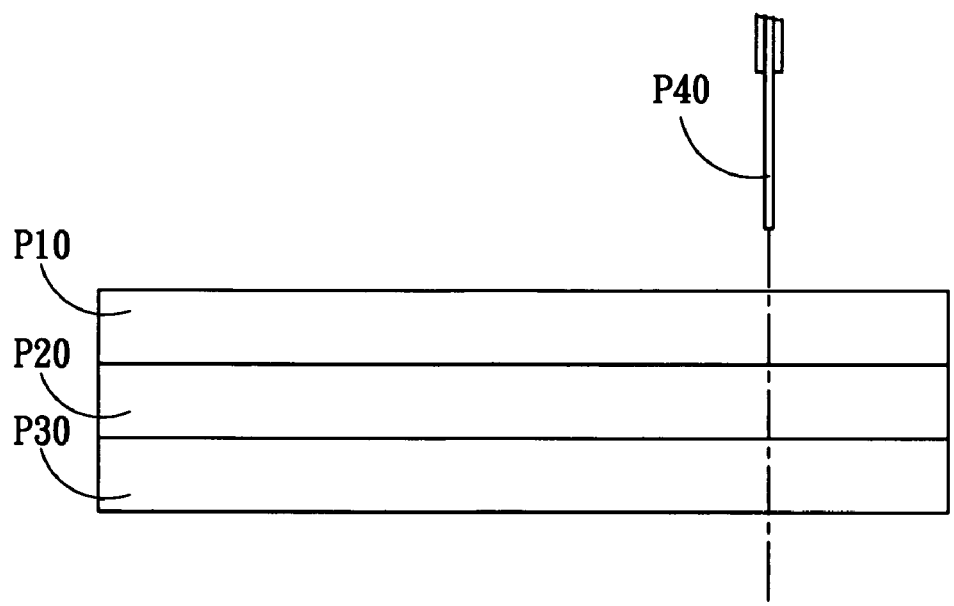
FIG. 1A and FIG. 1B schematically illustrate a conventional method to dice optical electronic wafer according to a reference coordinate.
Figure 1B:
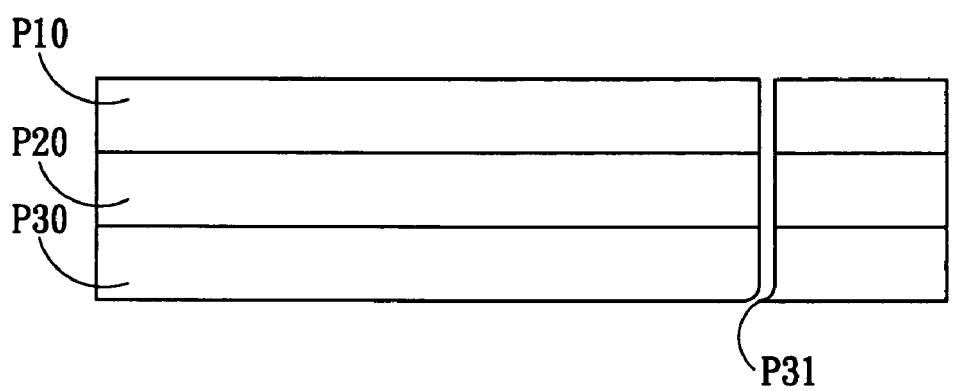
Figure 2A:
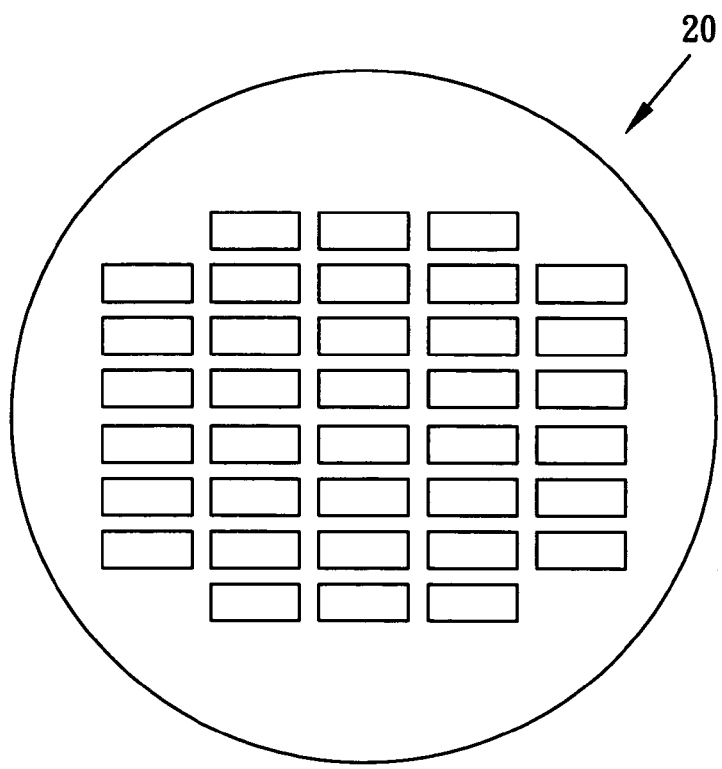
FIG. 2A and FIG. 2B are plane drawings schematically illustrating the formation of a reference coordinate on the second wafer according to one embodiment of the present invention.
Figure 2B:
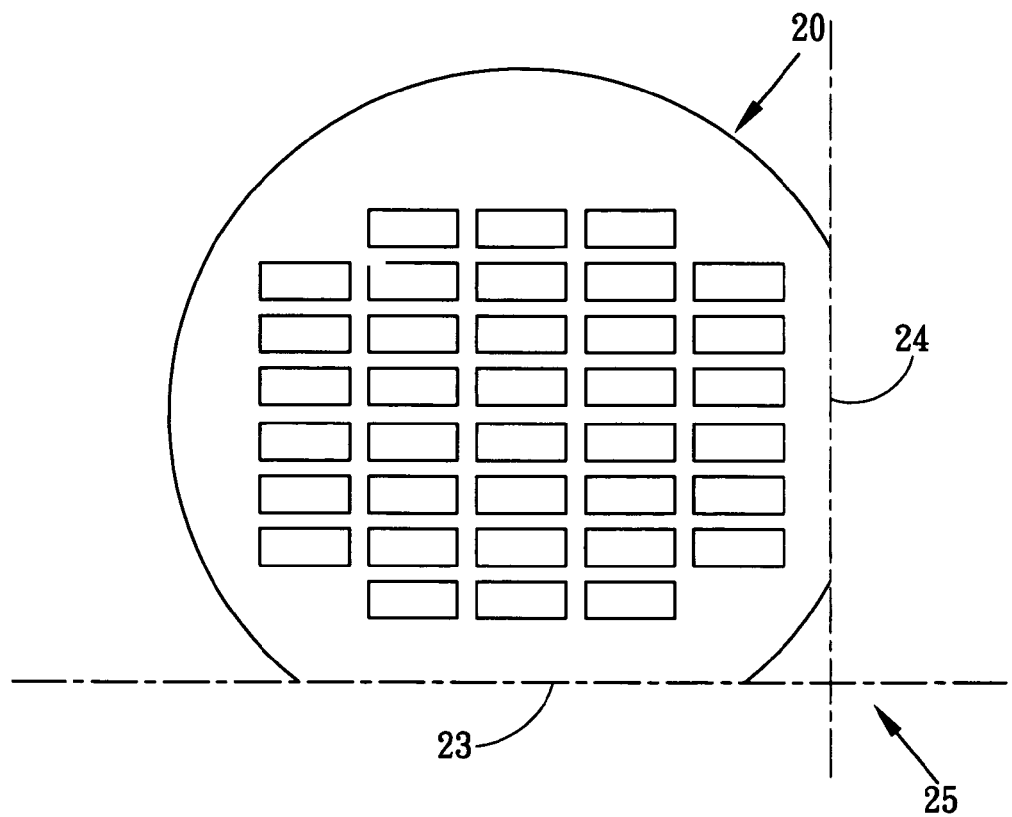

The embodiment of this invention discloses a wafer dicing process for optical electronic packing and the detail description is as following. FIG. 2A and FIG. 2B schematically illustrates the method to from a reference coordinate on a second wafer 20. FIG. 2A shows the second wafer 20 which is usually taken as an interposer wafer in optical electronic packing. As shown in FIG. 2B, the wafer can be etched to form a first flat 23 and a second flat 24 which are perpendicular to each other, and a reference coordinate 25 can be established according to these two flats. Subsequently, the reference coordinate 25 can use for the following alignment on the wafer dicing process.

Figure 3A:
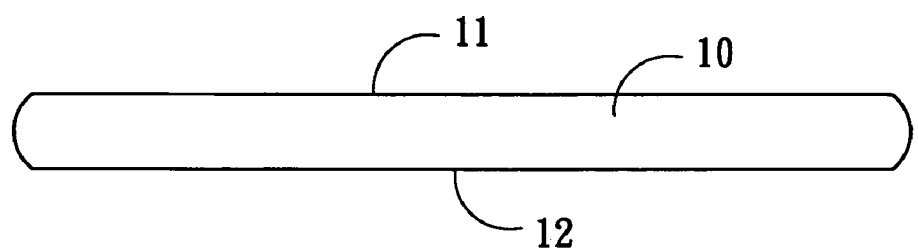
FIG. 3A to FIG. 3F are cross-sectional drawings schematically illustrating the process of dicing an optical electronic wafer according one embodiment of the present invention.
Figure 3B:
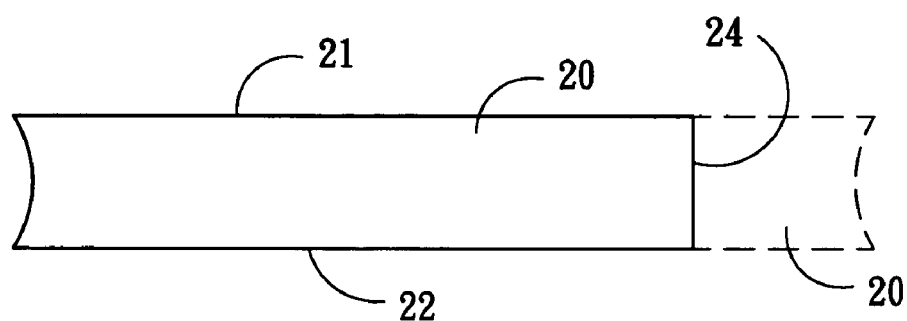
Figure 3C:
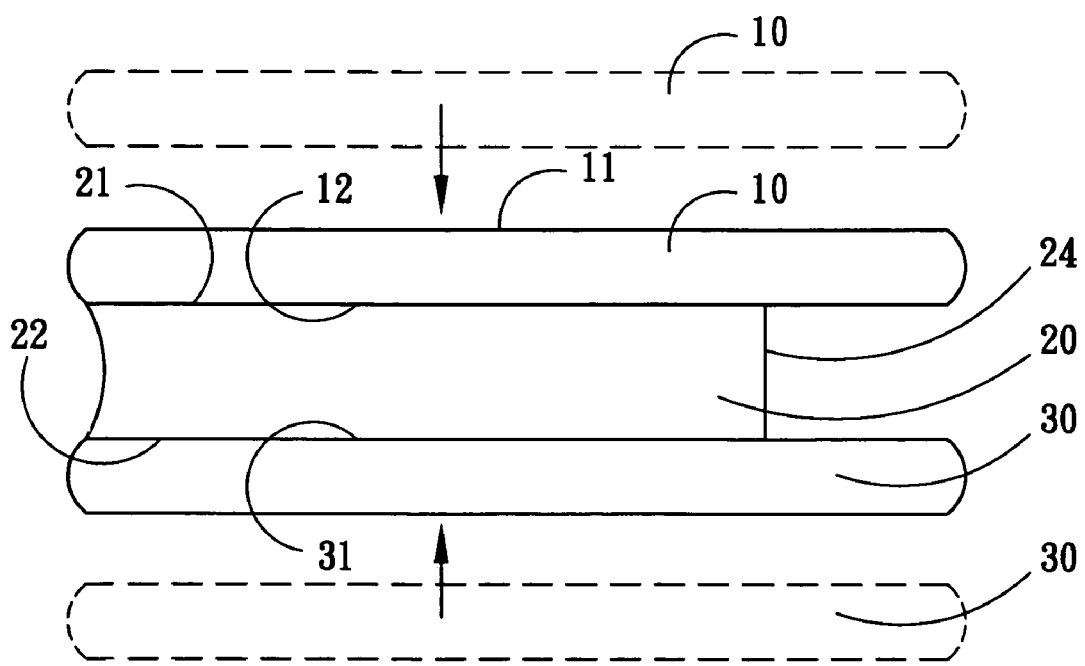
Figure 3D:
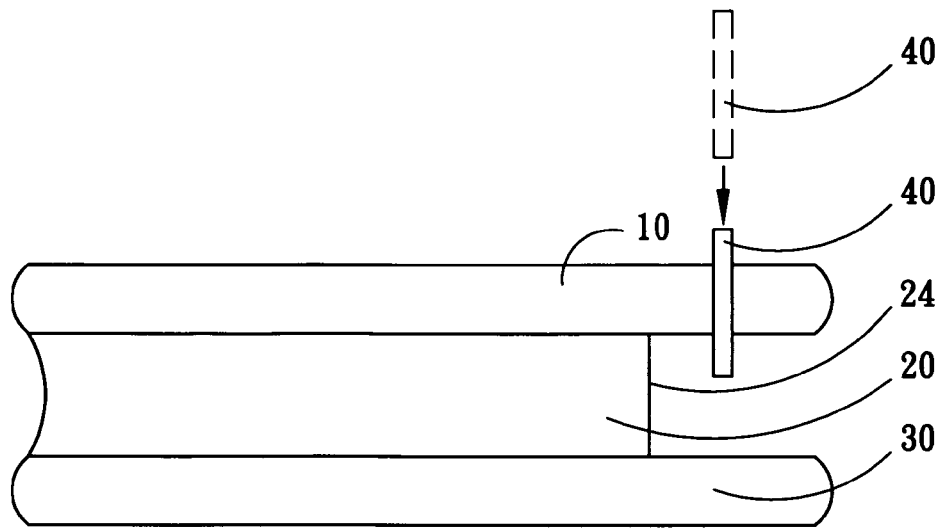
Figure 3E:
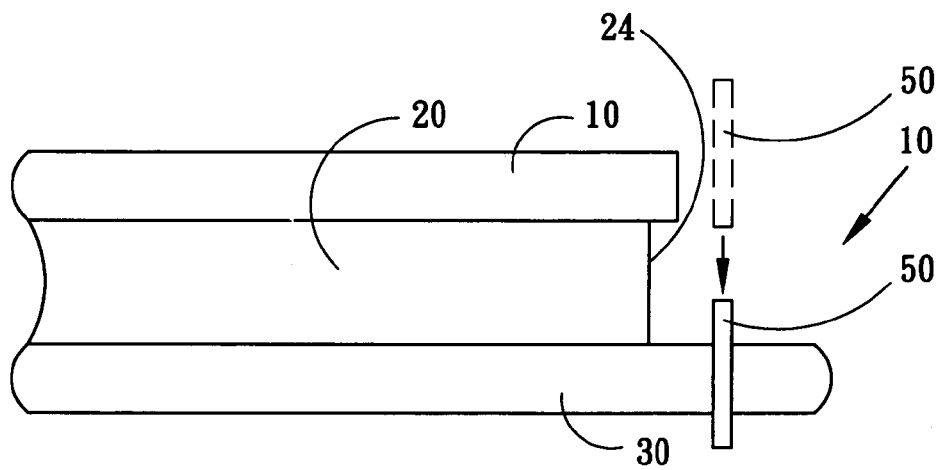
Figure 3F:
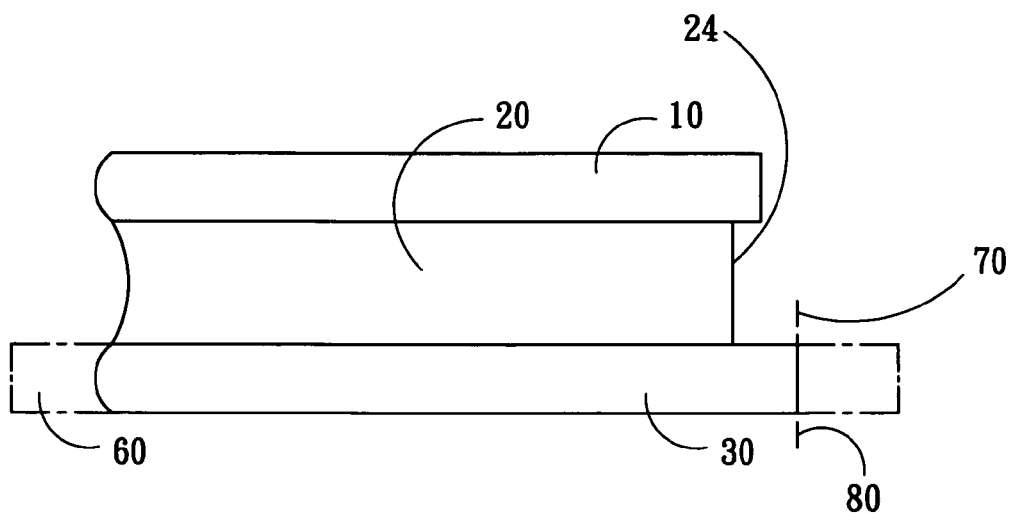

FIG. 3A to FIG. 3E schematically illustrates a wafer dicing process for optical electronic packing according to the embodiment of this invention. FIG. 3A shows a wafer 10 with a first upper surface 11 and a first lower surface 12, which is usually a glass wafer. FIG. 3B shows the second wafer with a second upper surface 21 and a second lower surface 22. And the details to form the reference coordinate 25 has described in the previous paragraph. First the first wafer 10 laminates with the second wafer 20, in which the first lower surface 12 of the first wafer 10 faces to the second upper surface 21 of the second wafer 20, and forming a wafer stack. A third wafer 30 with an active surface 31 is a CMOS (Complementary Metal-Oxide Semiconductor) wafer, in which the active surface 31 offers the function of input or output the electrical signals. The third wafer 30 is then laminated with the previous wafer stack to form an optical electronic wafer package as shown in FIG. 3C, in which the active surface 31 of the third wafer 30 faces to the second lower surface 22 of the second wafer.

Because the first wafer 10 is a transparent glass material, the reference coordinate 25 on the second wafer 20 can clearly monitor by looking through the first wafer 10. This enables to cut the first wafer 10 by a first dicing saw 40 from the first upper surface 11 along the first flat 23 and the second flat 24 to form flats and to reveal the third wafer 30 according to the reference coordinate 25 on the second wafer 20. Subsequently, the third wafer 30 is cut along the first flat 23 and the second flat 24 by a second dicing saw 50 to form a first reference axis 60 and a second reference axis 70 perpendicular each other according to the reference axis of the reference coordinate 25. According to these two perpendicular first axis 60 and second axis 70 on the third wafer, the backside reference dicing coordinate 80 can be established and further use for dicing the wafer stack to form optical electronic chips.

In the previous embodiment of this invention, the process to cut the first wafer 10 and the third wafer 30 are belonging to two separating steps, so that the first dicing saw 40 for cutting a glass wafer can be chosen while cutting the first wafer 10 which is consisted of glass material, and similarly the second dicing saw 50 for cutting CMOS wafer can be chosen while cutting the third wafer 30, that can elongate the lifetime of the dicing saws.

In addition, the method for laminating the first wafer 10 with the second 20 and wafer stack with the third wafer 30 can adopt the hot-pressing process to attach them together according to the previous embodiment.

It is further understood by those skilled in the art that the foregoing description is a preferred embodiment of the disclosed process and that various changes and modifications may be made in the invention without departing from the spirit and scope therefore.

What is claimed is:

1. A wafer dicing process of optical electronic packing to establish a backside dicing reference coordinate, said wafer dicing process comprising:

providing a first wafer with a first upper surface and a first lower surface, wherein said first wafer is a glass wafer;

providing a second wafer with a second upper surface and a second lower surface;

etching through part of said second wafer to form a first flat and a second flat perpendicular to each other;

laminating said first wafer on said second wafer, wherein said second upper surface of said second wafer faces said first lower surface of said first wafer;

providing a third wafer with an active surface;

laminating said third wafer under said second wafer, wherein said active surface of said third wafer faces said lower surface of said second wafer;

cutting through said first wafer from said first upper surface along said first flat and said second flat of said second wafer by a first dicing saw to reveal said third wafer; and cutting through said third wafer from said active surface along said first flat and said second flat of said second wafer by a second dicing saw to form a first reference axis and a second reference axis perpendicular to each other to establish said backside dicing reference coordinate, whereby said first flat and said second flat of said second wafer serve as a guide for cutting said first wafer and said third wafer.

2. The wafer dicing process for optical electronic packing according to claim 1, wherein said first dicing saw is specified for cutting said glass wafer.

3. The wafer dicing process for optical electronic packing according to claim 1, wherein said second wafer is an interposer wafer.

4. The wafer dicing process for optical electronic packing according to claim 1, wherein said third wafer is a CMOS (Complementary Metal-Oxide Semiconductor) wafer and said second dicing saw is specified for cutting said CMOS wafer.

5. The wafer dicing process for optical electronic packing according to claim 1, wherein the method for laminating said first wafer with said second wafer is hot-pressing.

6. The wafer dicing process for optical electronic packing according to claim 1, wherein the method for laminating said second wafer with said third wafer is hot-pressing.

* * * * *